United States Patent
Galy

(10) Patent No.: US 12,100,752 B2
(45) Date of Patent: Sep. 24, 2024

(54) MEMORY CELL

(71) Applicant: STMicroelectronics SA, Montrouge (FR)

(72) Inventor: Philippe Galy, Le Touvet (FR)

(73) Assignee: STMicroelectronics France, Montrouge (FR)

( * ) Notice: Subject to any disclaimer, the term of this patent is extended or adjusted under 35 U.S.C. 154(b) by 553 days.

(21) Appl. No.: 17/375,285

(22) Filed: Jul. 14, 2021

(65) Prior Publication Data

US 2022/0037513 A1 Feb. 3, 2022

(30) Foreign Application Priority Data

Jul. 28, 2020 (FR) ...................................... 2007956

(51) Int. Cl.
*H01L 29/739* (2006.01)
*H10B 41/40* (2023.01)
*H10B 99/00* (2023.01)

(52) U.S. Cl.
CPC ......... *H01L 29/7391* (2013.01); *H10B 41/40* (2023.02); *H10B 99/00* (2023.02)

(58) Field of Classification Search
None
See application file for complete search history.

(56) References Cited

U.S. PATENT DOCUMENTS

2019/0164973 A1* 5/2019 El Dirani ............... H10B 12/01
2019/0341478 A1* 11/2019 El Dirani ............. H01L 29/161

OTHER PUBLICATIONS

Cristoloveanu S. et al: "A review of the Z2-FET 1T-DRAM memory: Operation mechanisms and key parameters", Solid State Electronics., vol. 143, May 1, 2018 (May 1, 2018), pp. 10-19, XP055800225.
Jing Wan et al: "A systematic study of the sharp-switching Z2-FET device: From mechanism to modeling and compact memory applications", Solid State Electronics., vol. 90, Apr. 29, 2013 (Apr. 29, 2013), pp. 2-11, XP055493547.
INPI Search Report and Written Opinion for FR Appl. No. 2007956 dated Apr. 30, 2021 (9 pages).

* cited by examiner

*Primary Examiner* — Bilkis Jahan
(74) *Attorney, Agent, or Firm* — Crowe & Dunlevy LLC

(57) ABSTRACT

A cell includes a $Z^2$-FET-type structure that is formed with two front gates extending over an intermediate region between an anode region and a cathode region. The individual front gates of the two front gates are spaced apart by a distance that is shorter than 40% of a width of each individual front gate.

20 Claims, 4 Drawing Sheets

MEMORY CELL

PRIORITY CLAIM

This application claims the priority benefit of French Application for Patent No. 2007956, filed on Jul. 28, 2020, the content of which is hereby incorporated by reference in its entirety to the maximum extent allowable by law.

TECHNICAL FIELD

The present disclosure generally concerns electronic circuits and, more specifically, memory circuits. The present disclosure more particularly applies to the forming of a memory cell comprising a $Z^2$-FET-type structure.

BACKGROUND

Among the different types of electronic circuits used, memory circuits are circuits essential for the implementation of an electronic device.

The miniaturization of electronic devices, and the processing of an always greater amount of data currently is an important issue. This accordingly results in a need to miniaturize memory circuits.

It would be desirable to at least partly improve certain aspects of memory circuits.

There is a need for smaller memory circuits.

There is a need for memory circuits using structures of $Z^2$-FET type (which typically comprise, for example, a forward biased diode with an intermediate (intrinsic or lightly doped) channel that is partially covered by a front gate and with a remaining part of the intermediate channel being ungated).

There is a need for memory circuits using smaller $Z^2$-FET-type structures.

There is a need in the art which overcomes all or part of the disadvantages of known memory circuits.

SUMMARY

An embodiment provides a memory cell comprising a $Z^2$-FET-type structure comprising two front gates over an intermediate (for example, lightly doped) channel that are spaced apart by a distance shorter than 40% of a width of the two front gates.

According to an embodiment, the distance is in the order of 30% of the width of the two front gates.

According to an embodiment, a first gate and a second gate of the two front gates are separated from each other by an insulating spacer.

According to an embodiment, the two front gates have a 28-nm width.

According to an embodiment, the distance between the two front gates is in the order of 9 nm.

According to an embodiment, the $Z^2$-FET-type structure further comprises: an anode (P-type doped) region; a cathode (N-type doped) region; and a P-type doped intermediate region separating the anode region and the cathode region.

According to an embodiment, one of the front gates is insulated from and positioned on top of and in contact with a first portion of said intermediate region, and another one of the front gates is insulated from and positioned on top of and in contact with a second portion of said intermediate region.

According to an embodiment, the first portion of said intermediate region is in contact with the cathode region and the second portion of said intermediate region is in contact with the anode region.

According to an embodiment, the memory cell is formed on a substrate comprising a buried insulating layer.

According to an embodiment, the buried insulating layer has a thickness in the order of 25 nm.

According to an embodiment, the $Z^2$-FET-type structure further comprises two back gates.

According to an embodiment, one of the back gates is P-type doped, and the other back gate is N-type doped.

According to an embodiment, the P-type doped back gate is positioned under the first portion of said intermediate region and the N-type doped back gate is positioned under the second portion of said intermediate region.

According to an embodiment, the memory cell further comprises a selection transistor.

Another embodiment provides a memory circuit comprising at least one previously-described memory cell.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that the two elements can be connected or can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

As usual, the following terms are used: lightly-doped semiconductor layer designates a layer having a dopant atom concentration in the range from $10^{10}$ to $10^{14}$ atoms/cm$^3$; heavily-doped semiconductor layer designates a layer having a dopant atom concentration in the range from $10^{14}$ to $10^{17}$ atoms/cm$^3$; and very heavily-doped semiconductor layer designates a layer having a dopant atom concentration in the range from $10^{17}$ to $10^{20}$ atoms/cm$^3$.

Figure 1:
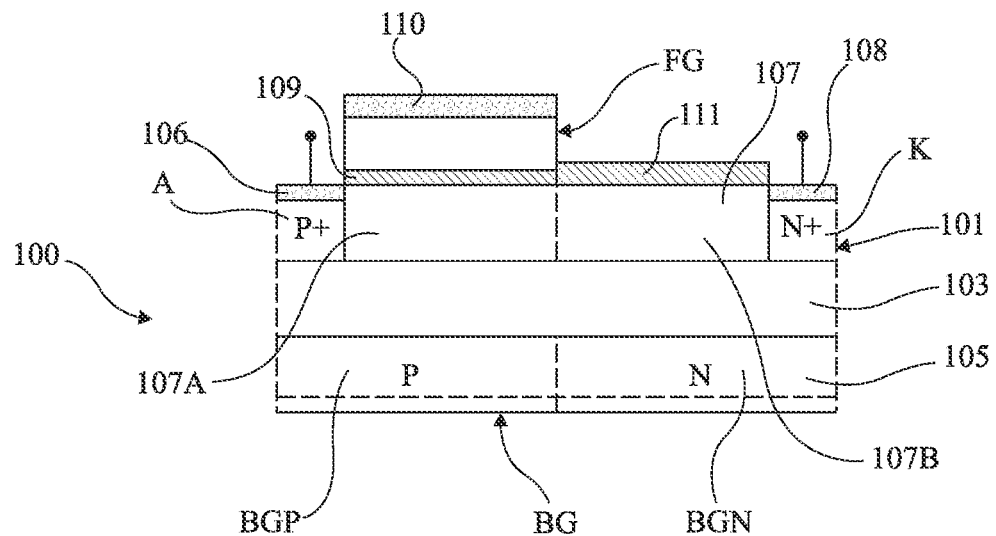
FIG. 1 shows a cross-section view of a $Z^2$-FET-type structure.

FIG. 1 is a cross-section view schematically showing a $Z^2$-FET-type structure 100 or $Z^2$-FET structure 100. In FIG. 1, the $Z^2$-FET structure is more particularly a $Z^2$-FET-type structure with a double ground plane (DGP).

Structure 100 is formed inside and on top of a SOI (Silicon On Insulator) structure comprising a semiconductor layer 101, for example made of silicon, resting on an insulating layer 103, designated with denomination BOX (Buried OXide), and itself resting on a semiconductor substrate 105, for example made of silicon, also called solid substrate 105. Insulating layer 103, for example, has a thickness in the order of 25 nm. Semiconductor substrate 105 is used as a back gate BG of structure 100.

An active layer is delimited in layer 101 and comprises anode and cathode regions A and K (or anode A and cathode K) separated by an intermediate region 107. Anode region A is heavily P-type doped (P+) and is on the left-hand side of FIG. 1. Anode region A is covered with a conductive layer 106, for example, made of a silicide, having one or a plurality of contacts formed thereon. Cathode region K is heavily N-type doped (N+) and is on the right-hand side of FIG. 1. Cathode region K is covered with a conductive layer 108, for example made of a silicide, having one or a plurality of contacts formed thereon. Intermediate region 107 is lightly P-type doped (P−) and is located between anode and cathode regions A and K.

Back gate BG is divided into a P-type doped portion BGP and an N-type doped portion BGN. As a variant, the back gate may be P-type doped only. Portion BGP is positioned on the side of anode A (on the left-hand side in FIG. 1) and portion BGN is positioned on the side of cathode K. Portions BGN and BGP are separated in FIG. 1 by dotted lines.

An insulated gate is formed on a portion 107A of layer 107 on the side of anode region A. The insulated gate comprises a gate layer FG (referred to as a "front gate"), for example, made of polysilicon, and an insulating layer 109 resting on the portion of layer 107. Gate layer FG is covered with a conductive layer 110, for example, made of a silicide, having one or a plurality of contacts formed thereon. The rest of layer 107, noted portion 107B, is covered with an insulating layer, or passivation layer 111.

A $Z^2$-FET structure of the type of the structure of FIG. 1 is a semiconductor structure capable of having a plurality of types of operation according to the voltages and to the currents which are applied to its different contact points. Such a structure may, for example, operate as a diode, or may also operate as a thyristor. When the structure operates as a diode, it may, for example, be used as a device of protection against electrostatic discharges. When the structure operates as a thyristor, the current-vs.-voltage characteristic of the structure may take a hysteresis shape, and the structure may thus be used to form a memory cell. It should be noted that the thyristor operation of a $Z^2$-FET structure may also be used as a protection against electrostatic discharges.

A method of manufacturing a structure of the type of structure 100 requires the use of: a first mask or assembly of masks intended to define the portion 107A having the front gate formed thereon; of a second mask or assembly of masks intended to define the portions of the structure which are not covered with a conductive layer, for example, made of silicide, enabling to form contacts; and of a third assembly of masks intended to prevent the additional doping of portion 107B of region 107, and to dope anode and cathode regions A and K.

In current manufacturing conditions, the second and third assemblies of masks are limiting elements for the miniaturization of a structure of the type of structure 100. Indeed, the masks generally used for such applications are often limited by a lack of accuracy relative to their sizing or to their spacing relative to other elements of the structure. More particularly, a disadvantage is that the forming of the second and third assemblies of masks make the forming of a contact on the insulated gate impossible and imposes the transfer thereof (as described in relation with FIG. 2). Such a disadvantage becomes increasingly worse as the gate width decreases. More particularly, this prevents the forming of a contact on an insulated gate having a gate width, for example, in the order of 28 nm.

Figure 2:
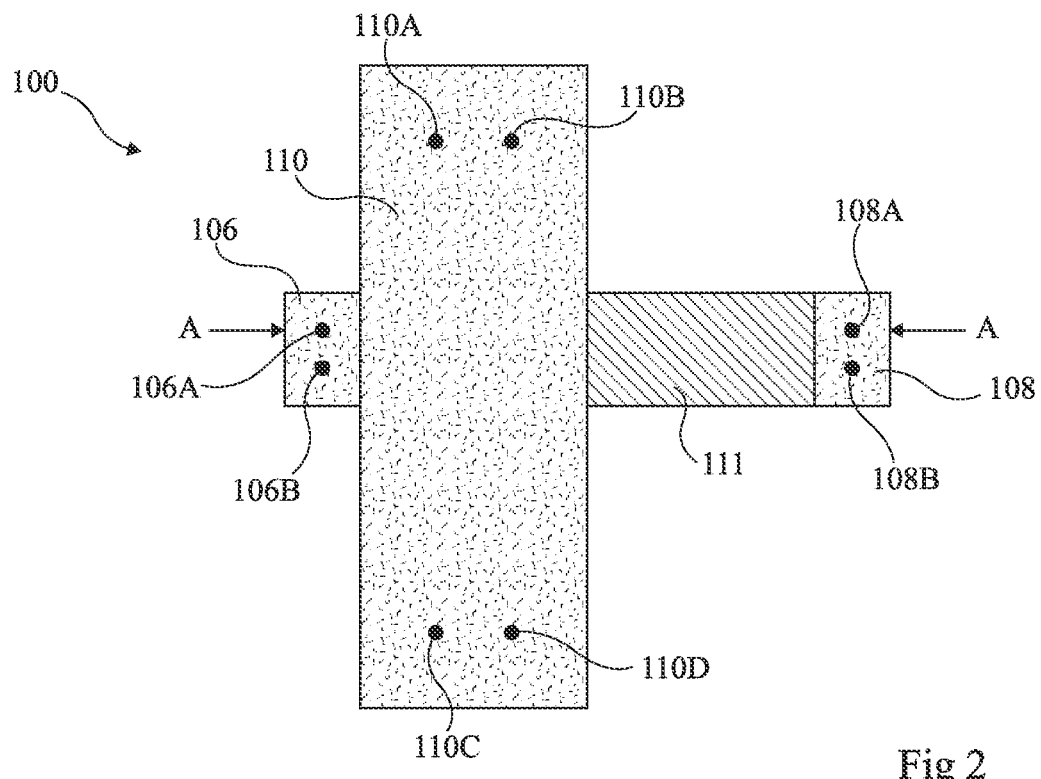
FIG. 2 shows a top view of the structure of FIG. 1.

FIG. 2 is a top view of the structure 100 described in relation with FIG. 1. FIG. 1 is a cross-section view of FIG. 2 along a plane A-A.

FIG. 2 shows silicide layers 106, 110, and 108 respectively covering the anode, front gate, and cathode regions, and insulating layer 111 covering portion 107B of layer 107. Contacts are formed on silicide portion 106 and on silicide layer 108. According to an embodiment, two contacts 106A and 106B are formed on layer 106, and two contacts 108A and 108B are formed on layer 108.

FIG. 2 shows that silicide layer 110 and the insulated gate of structure 100 are much wider than the rest of structure 100. Indeed, contacts 110A, 110B, 110C, and 110D are formed on layer 110 and are not aligned with the contacts 106A, 106B of layer 106 and the contacts 108A and 108B of layer 108. It is spoken of offset contacts 110A, 110B, 110C, and 110D. More particularly, contacts 110A and 110B are placed above contacts 106A, 106B, 108A, and 108B in FIG. 2, and contacts 110C and 110D are placed under contacts 106A, 106B, 108A, and 108B. It may be necessary to offset contacts in certain structure configuration, for example, when the contact forming may damage neighboring regions. In the present case, the forming of contacts on layer 110 might damage passivation layer 111, and thus disturb the operation of $Z^2$-FET structure 100.

Figure 3:
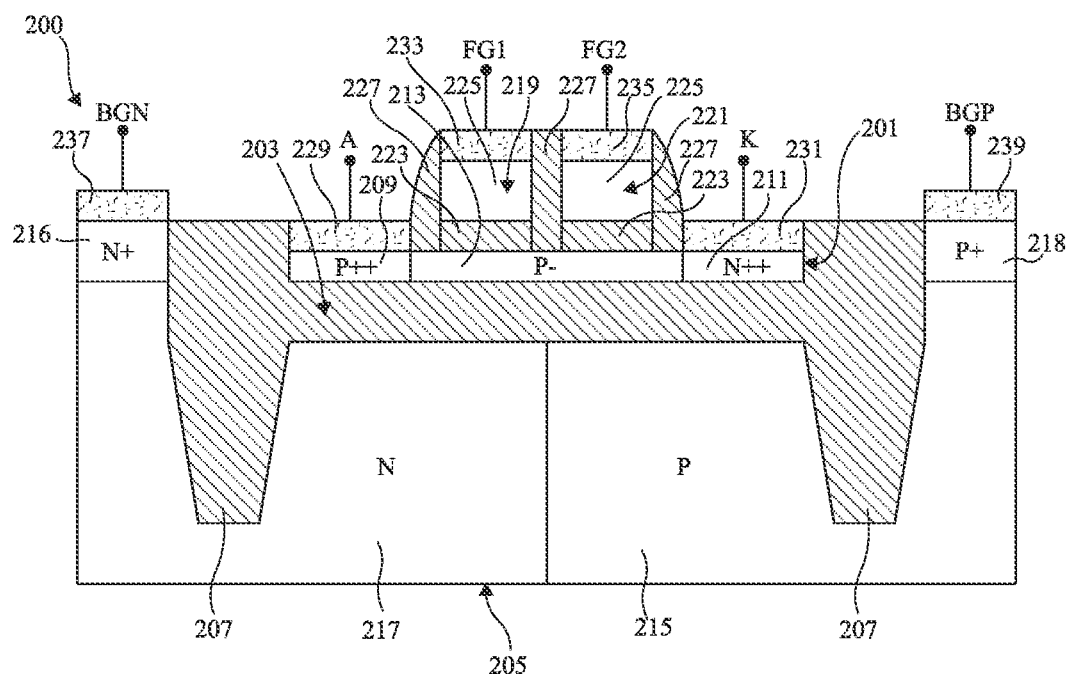
FIG. 3 shows a cross-section view of an embodiment of a $Z^2$-FET-type structure.

FIG. 3 is a cross-section view of an embodiment of a $Z^2$-FET-type structure 200. In FIG. 3, the $Z^2$-FET structure is more particularly a $Z^2$-FET-type structure with a double ground plane (DGP).

Like the structure 100 described in relation with FIG. 1, structure 200 is formed inside and on top of an SOI structure comprising a semiconductor layer 201, for example, made of silicon, resting on an insulating layer 203, designated with denomination BOX (Buried OXide) and itself resting on a semiconductor substrate 205, for example, made of silicon.

An active area is delimited in layer 201. The active area comprises anode and cathode regions 209 and 211 (or anode 209 and cathode 211) separated by an intermediate region 213. Anode region 209 is very heavily P-type doped (P++) and is on the left-hand side in FIG. 3. Cathode region 211 is very heavily N-type doped (N++) and is on the right-hand side in FIG. 3. Intermediate region 213 is lightly P-type doped (P−) and is located between anode and cathode regions 209 and 211. The active area is more particularly laterally delimited by insulating trenches 207 in layer 201. Insulating trenches 207 extend from the upper surface of semiconductor layer 201 and all the way to substrate 205. The insulating trenches however do not completely cross substrate 205.

Substrate 205 is used as a back gate of structure 200. The back gate is divided into a P-type doped portion 215 and an N-type doped portion 217. As a variant, the back gate may be P-type doped only. Portion 217 is positioned on the side of anode 209 (on the left-hand side in FIG. 3) and portion 215 is positioned on the side of cathode 211. Cathode contacting regions 216 and 218 are formed are formed outside of insulating trenches 207 and enable to couple the back gate to the front surface of structure 200. More particularly, contacting region 216 (on the left-hand side in FIG. 3) extends from the upper surface of substrate 205 of structure 200 and preferable across a thickness in the order of the thickness of layer 201 and is then directly in contact with portion 217 of the back gate. Contacting region 216 is heavily N-type doped (N+). Contacting region 218 (on the right-hand side in FIG. 2) extends from the upper surface of substrate 205 of structure 200 and preferably across a thickness in the order of the thickness of layer 201, and is then directly in contact with portion 215 of the back gate. Contacting area 218 is heavily P-type doped (P+).

Unlike the structure 100 of FIG. 1, instead of only comprising one insulated gate, the structure comprises two insulated gates 219 and 221 arranged on portions of intermediate region 213. The insulated gates are identical and formed at the same time during the method of manufacturing structure 100. Each insulated gate 219, 221 is formed of an insulating layer 223 resting on the portion of region 213, and of a gate layer 225, for example, made of polysilicon, resting on insulating layer 223. Insulated gates 219 and 221 are laterally insulated and insulated from each other by spacers 227. Thus, insulated gates 219 and 221 are separated from each other by a spacer 227 and are thus spaced apart by a distance equal to the width of spacer 227. The spacer 227 has a width, for example, smaller than approximately 40% of the width of one of insulated gates 219 or 221, for example, equal to approximately 30% of the width of one of gates 219 or 221. The spacer 227 has a thickness in a direction perpendicular to the widths of the insulated gates 219 or 221 that is at least as thick as, and is preferably greater than, a thickness of the electrically conducting portions (references 225, 233/235) of the insulated gates 219 or 221. The spacer 227 is further provided on lateral sidewalls of the insulated gates 219 or 221 over opposite ends of the intermediate region 213.

Further, contacts are formed on structure 100. More particularly, portions of silicide layers are deposited on the regions where contacts are desired to be formed. More particularly, the following are deposited: a portion 229 covering anode region 209 and enabling to form a contact coupled to a node A; a portion 231 covering cathode region 211 and enabling to form a contact coupled to a node K; a portion 233 covering the gate layer of insulated gate 219 and enabling to form a contact coupled to a node FG1; a portion 235 covering the gate layer of insulated gate 221 and enabling to form a contact coupled to a node FG2; a portion 237 covering contacting region 216 and enabling to form a contact coupled to a node BGN; and a portion 239 covering contacting region 218 and enabling to form a contact coupled to a node BGP.

Portion 235 is preferably separated from portion 233 by spacer 227 separating gates 219 and 221. Further, spacers 227 covering the lateral (side) walls of insulating layer 223 and the gate layers 225 of gates 219 and 221 preferably cover the lateral (side) walls of portions 235 and 233.

An advantage of this embodiment is that the two insulated gates 219 and 221 are simultaneously formed on intermediate region 213, and that the masks necessary to delimit the portion having the insulated gate of structure 100 resting thereon, to dope the different regions of layer 101, and to define the portions of the structure which are not covered with a silicide layer, are no longer useful. This enables to overcome the above-mentioned disadvantages of the structure 100 of FIG. 1. In particular, the disappearing of the masks enables to form a smaller $Z^2$-FET-type structure.

Another advantage of this embodiment is that the presence of a second insulated gate on the intermediate region enables to add new means for controlling the charges flowing through this region.

Figure 4:
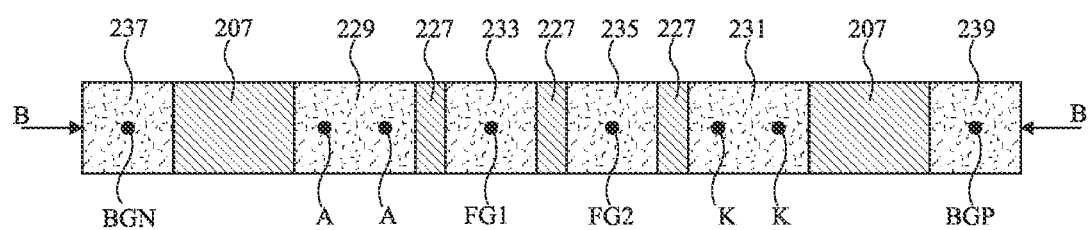
FIG. 4 shows a top view of the structure of FIG. 3.

FIG. 4 is a top view of the structure 200 described in relation with FIG. 3. FIG. 3 is a cross-section view of FIG. 4 along a plane B-B.

FIG. 4 shows, from left to right: silicide layer 237 covering contacting area 216, having the contact coupled to node BGN formed thereon; one of insulating trenches 207; silicide layer 229 covering anode region 209, having contacts, for example, two, coupled to node A, formed thereon; one of spacers 227; silicide layer 233 covering gate layer 225, and having a contact coupled to node FG1 formed thereon; one of spacers 227; silicide layer 235 covering gate layer 225, and having a contact coupled to node FG2 formed thereon; one of spacers 227; silicide layer 231 covering cathode region 211, and having contacts, for example two, coupled to node K, formed thereon; the other insulating trench 207; and silicide layer 239 covering contacting area 218 and having the contact coupled to node BGP formed thereon.

There appears in FIG. 4 that the different contacts formed on silicide layers 237, 229, 233, 235, 231, and 239 are all aligned, and that none of the contacts needs to be offset. This is an advantage of structure 200. Since no passivation layer is apparent, all contacts may be formed on a same line.

Figure 5:
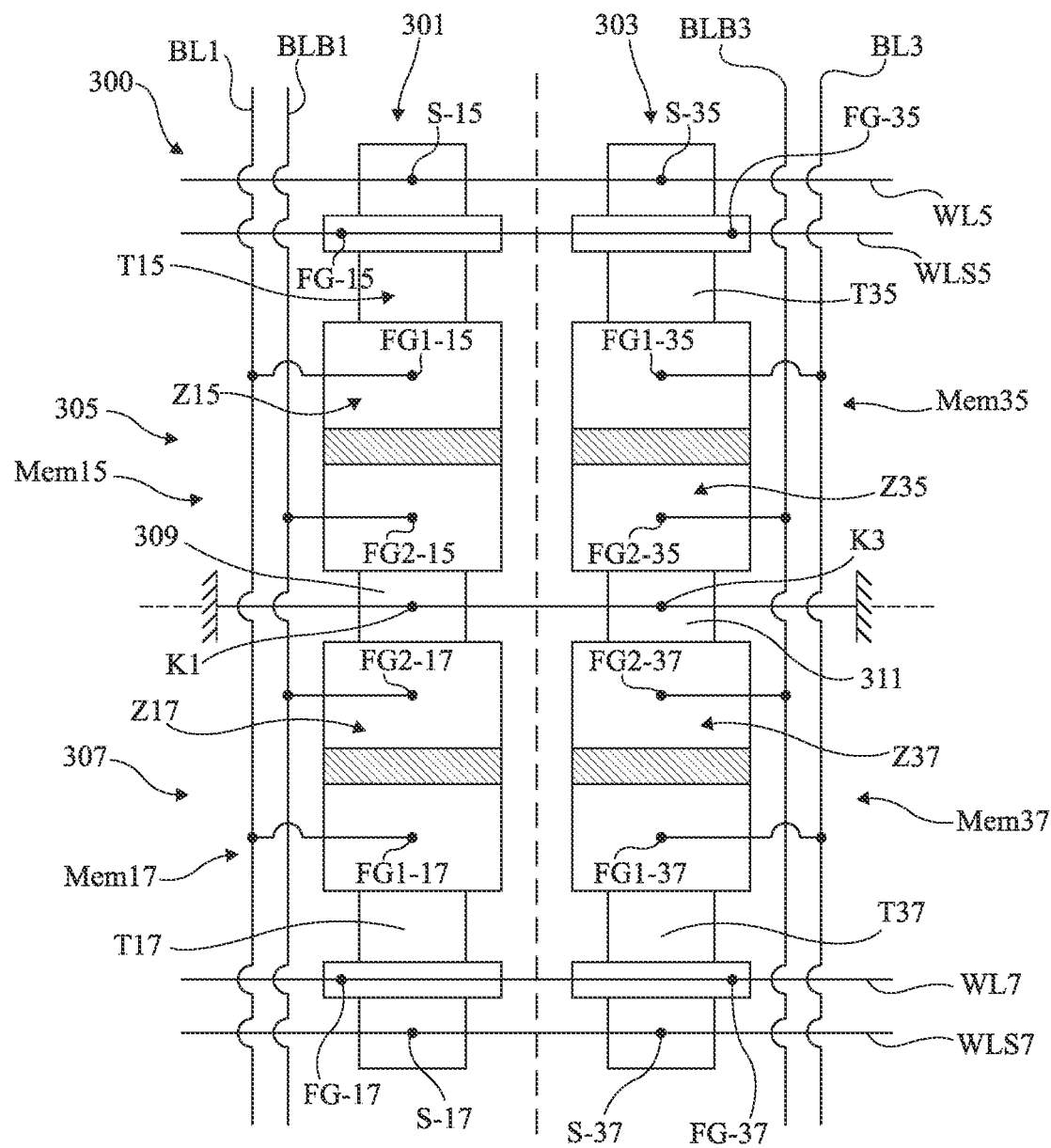
FIG. 5 shows a top view of an embodiment of a memory circuit.

FIG. 5 is a top view of an embodiment of a portion 300 of an embodiment of a memory circuit using $Z^2$-FET structures of the type of that described in relation with FIGS. 3 and 4.

Portion 300 comprises four memory cells arranged in two columns 301 and 303, and in two rows 305 and 307. More particularly, portion 300 comprises: a memory cell Mem15 at the intersection of column 301 and of row 305; a memory cell Mem17 at the intersection of column 301 and of row 307; a memory cell Mem35 at the intersection of column 303 and of row 305; and a memory cell Mem37 at the intersection of column 303 and of row 307.

Each memory cell Mem15, Mem17, Mem35, Mem37 respectively comprises a Z2-FET structure Z15, Z17, Z35, Z37, and a selection transistor T15, T17, T35, T37. All memory cells Mem15, Mem17, Mem35, and Mem37 are formed inside and on top of a same SOI structure. Selection transistors T15, T17, T35, T37 are, in the case described in relation with FIG. 5, P-channel MOSFET-type (Metal Oxide Semiconductor Field Effect Transistor) or MOS transistors.

In a same column, two consecutive $Z^2$-FET structures are arranged head-to-tail to share their cathode region. Thus, the $Z^2$-FET structures of memory cells Mem15 and Mem17 share an N-type doped cathode region 309, and the Z2-FET structures of memory cells Mem35 and Mem37 share an N-type doped cathode layer 311. Region 309 has a contact coupled to a node K1 formed thereon, and region 311 has a contact coupled to a node K3 formed thereon. Nodes K1 and K3 are for example coupled to a terminal receiving a reference voltage, for example, the ground.

Anode regions are arranged opposite the cathode regions of the $Z^2$-FET structures. The anode regions of $Z^2$-FET structures Z15, Z35, Z17, Z37 respectively are the drain regions of selection transistor T15, T35, T17, T37 associated with memory cells Z15, Z35, Z17, Z37.

As described in relation with FIGS. 3 and 4, the Z2-FET structures each comprise two insulated gates separated by a spacer. Concerning structure Z15, the insulated gate on the anode side has a contact coupled to a node FG1-15 formed thereon and the insulated gate on the cathode side has a contact coupled to a node FG2-15 formed thereon. Concerning structure Z35, the insulated gate on the anode side has a contact coupled to a node FG1-35 formed thereon and the insulated gate on the cathode side has a contact coupled to a node FG2-35 formed thereon. Concerning structure Z17, the insulated gate on the anode side has a contact coupled to a node FG1-17 formed thereon and the insulated gate on the cathode side has a contact coupled to a node FG2-17 formed thereon. Concerning structure Z37, the insulated gate on the anode side has a contact coupled to a node FG1-37 formed thereon and the insulated gate on the cathode side has a contact coupled to a node FG2-37 formed thereon.

Selection transistors T15, T35, T17, T37 comprise a gate region and a source region having contacts formed thereon. More particularly, in the case where the gate region has a width in the order of 28 nm, the contacts formed on the gate region are offset. Concerning structure Z15, the gate region has a contact coupled to a node FG-15 formed thereon and the source region has a contact coupled to a node S-15 formed thereon. Concerning structure Z35, the gate region has a contact coupled to a node FG-35 formed thereon and the source region has a contact coupled to a node S-35 formed thereon. Concerning structure Z17, the gate region has a contact coupled to a node FG-17 formed thereon and the source region has a contact coupled to a node S-17 formed thereon. Concerning structure Z37, the gate region has a contact coupled to a node FG-37 formed thereon and the source region has a contact coupled to a node S-37 formed thereon.

In such a structure, a plurality of architectures of connection of the memory cells to one another are possible. An example of one of them is described hereafter. It will be within the abilities of those skilled in the art to envisage other architectures of connection of the memory cells of portion 300. In particular, it will be within the abilities of those skilled in the art to exchange the bit lines and the word lines.

Each column 301, 303 of memory cells is coupled to two bit lines. More particularly, column 301 is coupled to a bit line BL1 and to a bit line BLB1, and column 303 is coupled to a bit line BL3 and to a bit line BLB3. More particularly, nodes FG1-15 and FG1-17 are coupled to bit line BL1, and nodes FG2-15 and FG2-17 are coupled to bit line BLB1. Nodes FG1-35 and FG1-37 are coupled to bit line BL3, and nodes FG2-35 and FG2-37 are coupled to bit line BLB3.

Each line 305, 307 of memory cells is coupled to a word line and to a selection word line. More particularly, line 305 is coupled to a word line WL5 and to a selection word line WLSS, and line 307 is coupled to a word line WL7 and to a selection word line WLS7. More particularly, nodes S-15 and S-35 are coupled to word line WL5, and nodes FG-15 and FG-35 are coupled to selection word line WLSS. Nodes S-17 and S-37 are coupled to word line WL7, and nodes FG-17 and FG-37 are coupled to selection word line WLS7.

According to an alternative embodiment, selection transistors T15, T35, respectively selection transistors T17, T37, may have a common source region having a single contact formed thereon, and a common gate region having a single contact formed thereon.

Figure 6:
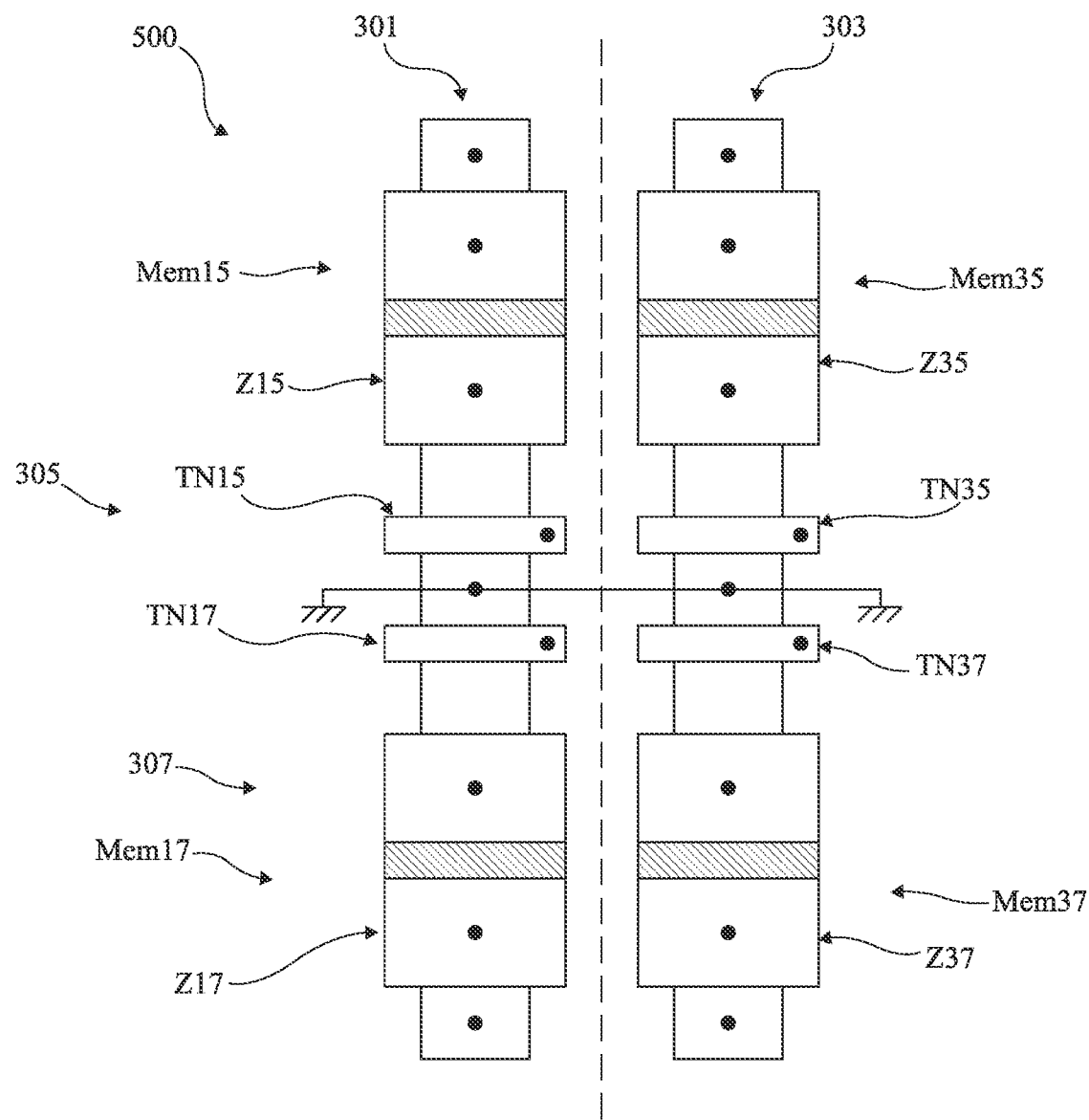
FIG. 6 shows a top view of another embodiment of a memory circuit.

FIG. 6 is a top view of a portion 500 of an embodiment of a memory circuit using Z2-FET structures of the type of that described in relation with FIGS. 3 and 4.

Portion 500 is similar to portion 300, with the difference that the memory cell selection transistors are N-channel MOS-type transistors. Thus, their drain regions are formed by the cathode regions of the Z2-FET structures associated therewith.

Memory cell Mem15 then comprises structure Z15 and a transistor TN15. Memory cell Mem17 comprises structure Z17 and a transistor TN17. The sources of transistors TN15 and TN17 are common.

Memory cell Mem15 comprises structure Z35 and a transistor TN35. Memory cell Mem37 comprises structure Z37 and transistor TN37. The sources of transistors TN35 and TN37 are common.

According to an alternative embodiment, selection transistors TN15, TN35, respectively selection transistors TN17, TN37, may have a common source region having a single contact formed thereon, and a common gate having a single contact formed thereon.

A connection architecture is not shown in FIG. 6 but, as in the memory portion described in relation with FIG. 5, according to an example, the front gates of the Z2-FET structures may be coupled to bit lines, and the anodes of the Z2-FET structures and the front gate of the selection transistors may be coupled to word lines.

Various embodiments and variants have been described. Those skilled in the art will understand that certain features of these various embodiments and variants may be combined, and other variants will occur to those skilled in the art. In particular, other memory circuit assemblies of the $Z^2$-FET-type structures are possible. Further, the embodiments described in relation with FIGS. 5 and 6 may be combined.

Finally, the practical implementation of the described embodiments and variations is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A memory cell, comprising:
a $Z^2$-FET-type structure comprising:
two front gates that extend over an intermediate region;
wherein said two front gates are spaced apart from each other by a distance that is shorter than 40% of a width of each front gate of the two front gates;
wherein the two front gates are separated from each other by an insulating spacer having a thickness in a direction perpendicular to the width of each front gate that is at least greater than a thickness of an electrically conducting portion of each front gate.

2. The memory cell according to claim 1, wherein the distance is in the order of 30% of the width of each front gate of the two front gates.

3. The memory cell according to claim 1, further comprising insulating spacers on lateral side walls of each front gate of the two front gates at opposite ends of the intermediate region.

4. The memory cell according to claim 1, wherein each front gate of the two front gates has a 28-nm width.

5. The memory cell according to claim 4, wherein the distance between the two front gates is in the order of 9 nm.

6. The memory cell according to claim 1, wherein the $Z^2$-FET-type structure further comprises:
- an anode region;
- a cathode region; and
- wherein said intermediate region separates the anode region from the cathode region.

7. The memory cell according to claim 6, wherein one of the front gates is insulated from and positioned on top of a first portion of said intermediate region, and another one of the front gates is insulated from and positioned on top of a second portion of said intermediate region.

8. The memory cell of claim 7, wherein the first portion of said intermediate region is in contact with the cathode region and the second portion of said intermediate region is in contact with the anode region.

9. The memory cell of claim 6, further comprising electrical contacts made to the cathode region, said one of the front gates, said another one of the front gates and the anode region, wherein said electrical contacts are all aligned with each other in a direction of the widths of the front gates.

10. The memory cell according to claim 6, being formed on a substrate comprising a buried insulated layer.

11. The memory cell according to claim 10, wherein the buried insulating layer has a thickness in the order of 25 nm.

12. The memory cell according to claim 6, wherein the $Z^2$-FET-type structure further comprises two back gates.

13. The memory cell according to claim 12, wherein one of the back gates is P-type doped, and the other back gate is N-type doped.

14. The memory cell according to claim 13, wherein one of the front gates is insulated from and positioned on top of a first portion of said intermediate region, and another one of the front gates is insulated from and positioned on top of a second portion of said intermediate region; and
- wherein the P-type doped back gate is positioned under and insulated from the first portion of said intermediate region and the N-type doped back gate is positioned under and insulated from the second portion of said intermediate region.

15. The memory cell of claim 14, wherein electrical contacts to the P-type doped back gate, the cathode region, said one of the front gates, said another one of the front gates, the anode region and the N-type doped back gate are all aligned with each other.

16. The memory cell according to claim 1, further comprising a selection transistor.

17. The memory cell according to claim 16, wherein the selection transistor comprises a first node connected to a word line, a gate connected to a word line select, and a second node connected to an anode of said $Z^2$-FET-type structure, and wherein a cathode of said $Z^2$-FET-type structure is connected to a reference node.

18. The memory cell according to claim 17, wherein a first bit line is connected to a first gate of said two front gates and wherein a second bit line is connected to a second gate of said two front gates.

19. The memory cell according to claim 1, wherein a first bit line is connected to a first gate of said two front gates and wherein a second bit line is connected to a second gate of said two front gates.

20. A memory circuit comprising at least one memory cell according to claim 1.

* * * * *